(12) United States Patent
Guter et al.

(10) Patent No.: US 10,636,927 B2
(45) Date of Patent: Apr. 28, 2020

(54) SOLAR CELL STACK

(71) Applicant: AZUR SPACE Solar Power GmbH, Heilbronn (DE)

(72) Inventors: Wolfgang Guter, Stuttgart (DE); Matthias Meusel, Heilbronn (DE)

(73) Assignee: Azur Space Solar Power GmbH, Heilbronn (DE)

(*) Notice: Subject to any disclaimer, the term of this patent is extended or adjusted under 35 U.S.C. 154(b) by 532 days.

(21) Appl. No.: 14/718,687

(22) Filed: May 21, 2015

(65) Prior Publication Data
US 2015/0340534 A1 Nov. 26, 2015

(30) Foreign Application Priority Data

May 21, 2014 (EP) .................................. 14001786

(51) Int. Cl.
H01L 31/0725 (2012.01)
H01L 31/0735 (2012.01)
(Continued)

(52) U.S. Cl.
CPC ...... *H01L 31/0725* (2013.01); *H01L 31/0687* (2013.01); *H01L 31/06875* (2013.01);
(Continued)

(58) Field of Classification Search
CPC ............. H01L 31/0725; H01L 31/0687; H01L 31/06875; H01L 31/0735; H01L 31/065;
(Continued)

(56) References Cited

U.S. PATENT DOCUMENTS

2006/0144435 A1* 7/2006 Wanlass ............ H01L 31/06875
136/249
2009/0229659 A1 9/2009 Wanlass et al.
(Continued)

FOREIGN PATENT DOCUMENTS

CN 103258908 A 8/2013
DE 10 2012 004 734 A1 9/2013
(Continued)

OTHER PUBLICATIONS

Zakaria, A, et al, "Comparison of arsenide and phosphide based graded buffer layers used in inverted metamorphic solar cells", Journal of Applied Physics 112, 024907 (2012).*
(Continued)

*Primary Examiner* — Michael Y Sun
(74) *Attorney, Agent, or Firm* — Muncy, Geissler, Olds & Lowe, P.C.

(57) ABSTRACT

A solar cell stack having a first semiconductor solar cell that has a p-n junction of a first material with a first lattice constant and a second semiconductor solar cell that has a p-n junction of a second material with a second lattice constant. The solar cell stack has a metamorphic buffer that includes a sequence of a first, lower layer and a second, center layer, and a third, upper layer, and includes an InGaAs or an AlInGaAs or an InGaP or an AlInGaP compound. The metamorphic buffer is formed between the first and second semiconductor solar cells and the lattice constant in the metamorphic buffer changes along the buffer's thickness dimension. The lattice constant of the third layer is greater than the lattice constant of the second layer, and the lattice constant of the second layer is greater than the lattice constant of the first layer.

19 Claims, 3 Drawing Sheets

(51) Int. Cl.
*H01L 31/0687* (2012.01)
*H01L 31/076* (2012.01)
*H01L 31/18* (2006.01)
*H01L 27/30* (2006.01)
*H01L 31/0693* (2012.01)
*H01L 31/041* (2014.01)
*H01L 31/065* (2012.01)
*H01L 31/12* (2006.01)
*H01L 33/00* (2010.01)
*H01L 49/02* (2006.01)
*H01L 21/02* (2006.01)
*H01L 41/08* (2006.01)
*H01L 33/50* (2010.01)

(52) U.S. Cl.
CPC .... *H01L 31/0735* (2013.01); *H01L 21/02304* (2013.01); *H01L 27/302* (2013.01); *H01L 28/56* (2013.01); *H01L 31/041* (2014.12); *H01L 31/065* (2013.01); *H01L 31/0693* (2013.01); *H01L 31/076* (2013.01); *H01L 31/12* (2013.01); *H01L 31/184* (2013.01); *H01L 31/1844* (2013.01); *H01L 31/1848* (2013.01); *H01L 33/002* (2013.01); *H01L 33/508* (2013.01); *H01L 41/0815* (2013.01); *Y02E 10/544* (2013.01)

(58) Field of Classification Search
CPC ....... H01L 31/12; H01L 33/002; H01L 28/56; H01L 21/02304; H01L 41/0815; H01L 33/508; H01L 31/041; H01L 31/0693; H01L 31/076; H01L 31/1844; H01L 31/1848; H01L 27/302; H01L 31/184; H01L 31/03046; Y02E 10/544
See application file for complete search history.

(56) References Cited

U.S. PATENT DOCUMENTS

2011/0220190 A1* 9/2011 Lee .................. H01L 31/03046
136/255
2011/0290312 A1* 12/2011 Agui .................. H01L 31/1852
136/255
2013/0312818 A1 11/2013 Cornfeld et al.
2014/0305498 A1* 10/2014 Liu .................. H01L 31/06875
136/255
2015/0053257 A1 2/2015 Dimroth et al.

FOREIGN PATENT DOCUMENTS

EP          2 610 924 A1      7/2013
WO    WO 2013/132073 A2      9/2013

OTHER PUBLICATIONS

Fetzer, C.M. et al, "High-efficiency metamorphic GaInP/GaInAs/Ge solar cells grown by MOVPE" Journal of Crystal Growth 261 (2004) 341-348.*
Swarup, P., Jain, R. K., Verma, S. N., Charan, S. and Tandle, D. M. (1982), LPE Growth of GaInAlAs on GaAs. phys. stat. sol. (a), 72: K189-K192.*
http://www.semiconductors.co.uk/propiiiv5653.htm#GaP,GaAs,GaSb.*
Examiner calculation notes.*
NSM Archive, http://www.ioffe.ru/SVA/NSM/Semicond/GaInP/basic.html (Year: 2011).*
NSM Archive, http://www.ioffe.ru/SVA/NSM/Semicond/GaInAs/thermal.html (Year: 2011).*
Jan Schöne, "Kontrolle von Spannungsrelaxation und Defektbildung in metamorphen III-V Halbleiterheterostrukturen fuer hocheffiziente Solarzellen (control of strain-relaxation and defect formation in metamorphic III-V semiconductor heterostructures for high-efficiency semiconductor solar cells)," Dissertation for Engineering faculty of Christian-Albrechts-Universitaet of Kiel, pp. 1-150 (2009) with English translation.
Klinger et al., "Determination of hardness and Young's modules for important III-V compound semiconductors," Thin Solid Films, vol. 548, No. 29, pp. 358-365 (Aug. 29, 2013).
Grassman et al., "Expanding the Palette: Metamorphic Strategies over Lattice Constant Ranges for Extending the Spectrum of Accessible Photovoltaic Materials," 37$^{th}$ IEEE Photovoltaic Spec. Conf., pp. 3375-3380 (Jun. 19, 2011).
Cotal et al., "III-V multijunction solar cells for concentrating photovoltaics," Energy & Env. Sci., vol. 2, No. 2, pp. 174-192 (Dec. 10, 2008).
Zakaria et al., "Comparison of arsenide and phosphide based graded buffer layers used in inverted metamorphic solar cells," J. Appl. Phys., vol. 112, pp. 024907-1-024907-8 (2012).
Guter et al., "Current-matched triple-junction solar cell reaching 41.1% conversion efficiency under concentrated sunlight," Appl. Phys. Let., vol. 94, pp. 223504-1-223504-3 (2009).
Jan Schöne, "Kontrolle von Spannungsrelaxation und Defektbildung in metamorphen III-V Halbleiterheterostrukturen fuer hocheffiziente Solarzellen (control of strain-relaxation and defect formation in metamorphic III-V semiconductor heterostructures for high-efficiency semiconductor solar cells)," Dissertation for Engineering faculty of Christian-Albrechts-Universitaet of Kiel, pp. 1-150 (2009).
Klingler et al., "Elastische und plastische Eigenschaften von III-V Halbleiten fuer metamorphe Pufferstrukturen (elastic and plastic properties of III-V semiconductors for metamorphic buffer structures)," 27$^{th}$ DGKK Workshop, Erlangen, Germany (Dec. 6-7, 2012).

* cited by examiner

SOLAR CELL STACK

This nonprovisional application claims priority under 35 U.S.C. § 119(a) to European Patent Application No. 14 001 786.4, which was filed in Europe on May 21, 2014, and which is herein incorporated by reference.

BACKGROUND OF THE INVENTION

Field of the Invention

The invention relates to a solar cell stack.

Description of the Background Art

In the epitaxy of III-V multi-junction solar cells, so-called metamorphic buffers are used in order to deposit on the metamorphic buffers high-quality semiconductor layers of materials with a different lattice constant than that of the substrate, or of layers located below the buffer. By means of the metamorphic buffer, a so-called "virtual substrate" is formed having a lattice constant different from that of the original substrate. As a result, it is possible to achieve greater latitude in the choice of materials, in particular for the various elements of a multi-junction solar cell, and to improve the efficiency of the multi-junction solar cell.

It is desirable for the lattice constant of the metamorphic buffer to be increased in general during manufacture. By this means, most layers of the buffer are compressively strained, with the dislocations forming in a more homogeneous manner, and in particular fewer cracks arising, as compared to a tensilely strained buffer. Moreover, it is desirable for all layers of the metamorphic buffer to be transparent to light of certain wavelengths so that the light can be used in the other solar cells for photoelectric energy conversion.

Multiple solar cell stacks having a metamorphic buffer are known from "Comparison of arsenide and phosphide based graded buffer layers used in inverted metamorphic solar cells," by A. Zakaria, Richard R. King, M. Jackson, and M. S. Goorsky in *J. Appl. Phys.* 112, 024907 (2012). In addition, solar cell stacks with metamorphic buffers are known from US 2013/0312818 A1. Also, metamorphic solar cell stacks as depicted in FIG. 3 of the present application are disclosed in "Current-matched triple junction solar cell reaching 41.1% conversion efficiency under concentrated sunlight," by W. Guter, J. Schöne, S. P. Philipps, M. Steiner, G. Siefer, A. Wekkeli, E. Welser, E. Oliva, A. Bett, and F. Dimroth, in *Applied Physics Letters* 94, 223504 (2009).

Additional solar cell stacks with metamorphic buffers are disclosed in J. Schöne, dissertation entitled "Kontrolle von Spannungsrelaxation und Defektbildung in metamorphen III-V Halbleiterheterostrukturen für hocheffiziente Halbleiter-Solarzellen" [control of strain relaxation and defect formation in metamorphic III-V semiconductor heterostructures for high-efficiency semiconductor solar cells], 2009, Faculty of Engineering at Kiel University, Germany.

Furthermore, it is desirable in metamorphic buffers to relieve lattice strains through the formation of dislocations or other crystal defects in the buffers themselves, with the crystal defects remaining localized in the buffers as much as possible. In particular, threading dislocations should be prevented from propagating into other parts of the semiconductor layer stack. To this end, it is preferred to have the hardness of the buffer layers in the metamorphic buffers increase with the lattice constant, in order, in particular, to reduce the propagation of dislocations into layers located thereabove and/or to hinder the relaxation of layers located thereabove. In contrast thereto, it is disclosed by V. Klinger, T. Rosener, G. Lorenz, M. Petzold, and F. Dimroth, in "Elastische und plastische Eigenschaften von III-V Halbleitern für metamorphe Pufferstrukturen" [elastic and plastic properties of III-V semiconductors for metamorphic buffer structures], 27$^{th}$ DKGG Workshop, "Epitaxie von III/V-Halbleitern," Erlangen, Germany, Dec. 6-7, 2012, that for a metamorphic buffer in the case of the ternary compound A10.4InxGa0.6-x (0<x<0.6) in which the element gallium is successively replaced by indium, the lattice constant increases with the indium content, while the nanohardness decreases.

SUMMARY OF THE INVENTION

It is therefore an object of the invention to provide a device that advances the state of the art.

According to an embodiment of the invention, a solar cell stack is provided, having a first semiconductor solar cell, wherein the first semiconductor solar cell has a p-n junction of a first material with a first lattice constant, and having a second semiconductor solar cell, wherein the second semiconductor solar cell has a p-n junction of a second material with a second lattice constant, and wherein the first lattice constant is smaller than the second lattice constant, and the solar cell stack has a metamorphic buffer, wherein the metamorphic buffer comprises a sequence of consecutive layers with a first, lower layer and a second, center layer, and a third, upper layer, and the metamorphic buffer comprises an InGaAs and/or an AlInGaAs and/or an InGaP and/or an AlInGaP compound, and the metamorphic buffer is formed between the first semiconductor solar cell and the second semiconductor solar cell, and the lattice constant in the metamorphic buffer changes along the buffer's thickness dimension, and wherein the second layer has a higher Al content than the first layer and than the third layer and/or the second layer has a lower phosphorus content than the first layer and the third layer has a phosphide compound, and the lattice constant of the third layer is greater than the lattice constant of the second layer and the lattice constant of the second layer is greater than the lattice constant of the first layer.

It should be noted that the minimum number of layers in the metamorphic buffer is three, but depending on the application six layers or up to thirty or more individual layers can be produced. In addition, it should be noted that the individual layers of the metamorphic buffer generally are made thin, preferably below 600 nm, and extremely preferably below 300 nm. In addition, the lattice constant of a material always refers to the unstrained state. In particular, at the interface between two layers, the lateral (in-plane) lattice constants of the two adjacent layers are nearly identical, while the vertical (out-of-plane) lattice constants and the lattice constant in the unstrained state differ.

An advantage of the device according to an embodiment of the invention is that the formation of an especially soft layer, which is to say a layer with a low nanohardness, takes place within the buffer as a result of the high Al content in the second layer of the metamorphic buffer despite a further increasing lattice constant. This facilitates a formation of mismatch dislocations in the second layer. In particular, investigations have shown that the dislocations form by preference in the second layer and remain in the second layer, and do not advance into the active layers of the semiconductor solar cells located below and/or above it. An undesirable reduction in the charge carriers in the active layers and a reduction in the efficiency of the semiconductor solar cells in the solar cell stack are prevented in this way. In other words, the introduction of the second layer with a higher aluminum content than the first layer and the third layer, and if applicable also as compared to other layers of the metamorphic buffer, introduces a "predetermined breaking point" in that the second layer is made especially soft. A "soft layer" can be understood to be, for example, a lower nanohardness of the selected layer in comparison to the surrounding layers of the metamorphic buffer.

Another advantage is that with the introduction of the second layer, a bending of the semiconductor substrate due to the effects of compressive or tensile stress is reduced. Particularly in the epitaxial growth of additional layers, better homogeneity and better reproducibility of layer growth are achieved, and all layers of the solar cell stack can be produced in situ. As a result, semiconductor solar cells with very different lattice constants or band spacing, hereinafter also referred to as energy of the band gaps, can be grown on one another easily, economically, and with high efficiency within the framework of an epitaxy process. The defects or dislocations within the semiconductor solar cells are reliably suppressed by the "predetermined breaking point."

Another advantage is that the solar cell stack according to an embodiment of the invention has a lower residual strain after its manufacture. This results in increased operational reliability and higher efficiencies in the solar cell stacks.

Another advantage is that multiple semiconductor solar cells with different lattice constants and band gaps can easily be joined. It is an advantage that the individual semiconductor solar cells with the band gaps can be joined to form the solar cell stack in such a manner that the overall efficiency of the solar cell stack is increased.

In an embodiment, the lattice constant of the metamorphic buffer increases from layer to layer in the direction of the second semiconductor solar cell, for example, by at least 0.003 Å at a time or by at least 0.005 Å at a time.

In an embodiment, one layer of the metamorphic buffer can have a third lattice constant. The third lattice constant is greater than the lattice constant of the second semiconductor solar cell. Investigations have shown that the relaxation of the metamorphic buffer can be further improved by this means.

In an embodiment, the second layer can have a greater lattice constant than the first semiconductor solar cell. In an embodiment, a fourth layer can be provided in the metamorphic buffer, wherein the fourth layer is located above the third layer and is integrally joined to the third layer. In addition, the fourth layer has a smaller lattice constant than the second semiconductor solar cell.

In an embodiment, the second layer of the metamorphic buffer can have a lattice constant of equal size to that of the second semiconductor solar cell, or in another alternative, the second layer of the metamorphic buffer can have a lattice constant that is a maximum of 0.008 Å greater than that of the second semiconductor solar cell.

In an enhancement, the Al content of the second layer can be greater than the Al content of any other layer of the metamorphic buffer. For example, the softest layer can be formed at a predetermined position within the metamorphic buffer, and the dislocations preferably form at a predetermined location in the buffer.

In an embodiment, only InGaAs layers and/or AlInGaAs layers can be formed within the sequence of three layers of the metamorphic buffer. In an alternative embodiment, only InGaP layers and/or AlInGaP layers are formed within the sequence of three layers of the metamorphic buffer. Additional substances can be formed in addition to the compounds InGaAs, AlInGaAs, InGaP, and AlInGaP.

In an embodiment, the first layer is integrally joined to the second layer, and the second layer is integrally joined to the third layer. In one enhancement, the first layer and the third layer have a greater nanohardness than the second layer. In this way, a continuation of the dislocations from the second layer into the surrounding layers is suppressed effectively.

In another embodiment, a third semiconductor solar cell can be provided, wherein an additional metamorphic buffer can be formed between the second semiconductor solar cell and the third semiconductor solar cell. In other words, in the solar cell stack as a whole, two metamorphic buffers are formed that are spatially separated from one another. In another embodiment, a sequence of two metamorphic buffers can be formed between two semiconductor solar cells. In particular, another metamorphic buffer can be formed between the first semiconductor solar cell and the second semiconductor solar cell in addition to the metamorphic buffer. Furthermore, each of the semiconductor solar cells can contain a p-n junction. Furthermore, it should be noted that the metamorphic buffer layers are not part of a p-n junction of a tunnel diode.

In another embodiment, the second layer has no nitride compound. By this means, an increase in the especially low nanohardness of the second layer is avoided.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
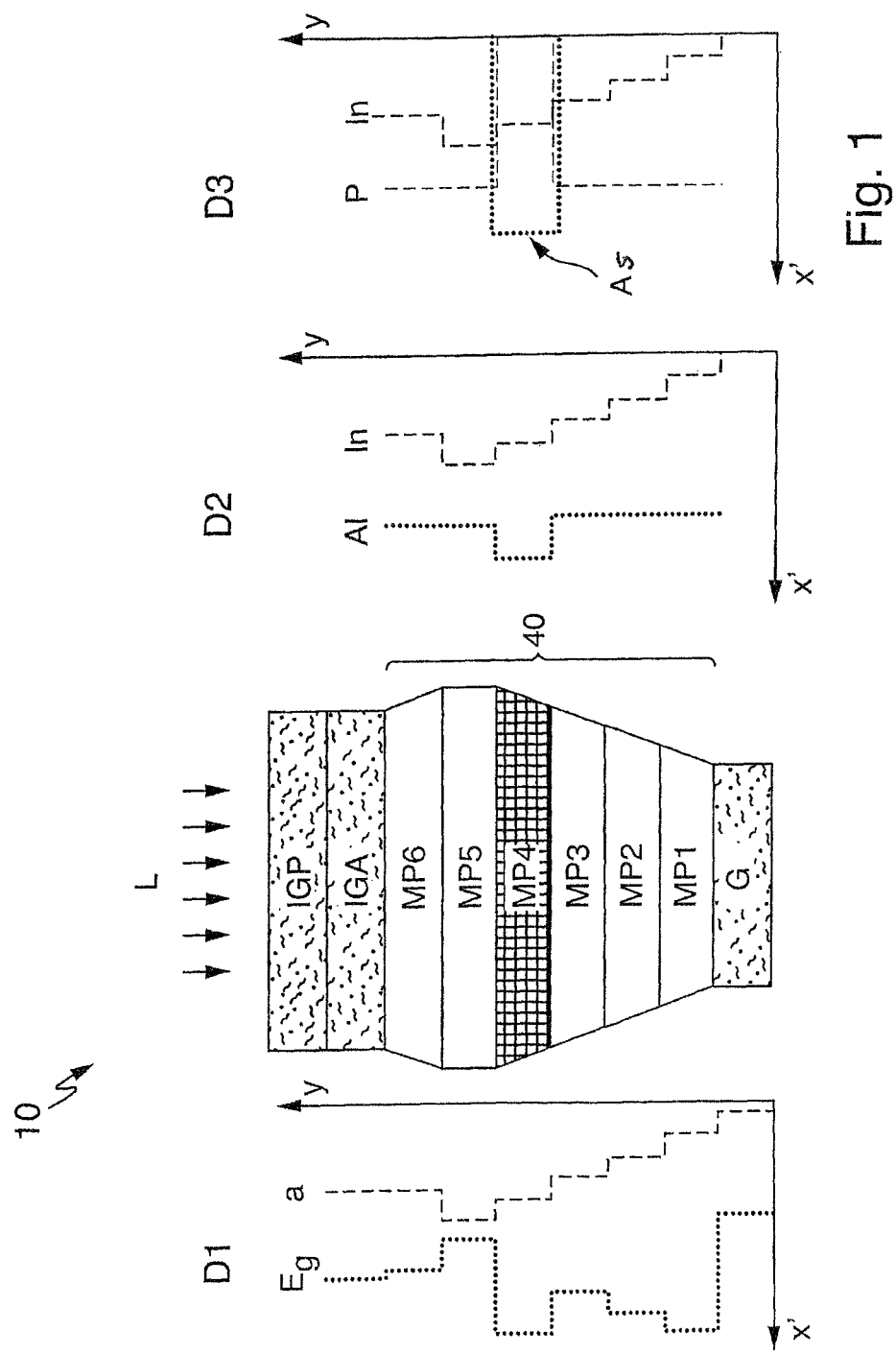
FIG. 1 shows a solar cell stack with a metamorphic buffer according to an exemplary embodiment.

The illustration in FIG. 1 shows a schematic view of a solar cell stack 10 with a first semiconductor solar cell G, wherein the first semiconductor solar cell G has a p-n junction of a first material with a first lattice constant—shown in a diagram D1, and with a second semiconductor solar cell IGA, and a third semiconductor solar cell IGP, wherein the second semiconductor solar cell IGA has a p-n junction of a second material with a second lattice constant—shown in a diagram D1, and wherein the first lattice constant is smaller than the second lattice constant. Formed between the first semiconductor solar cell G and the second semiconductor solar cell IGA of the solar cell stack 10 is a metamorphic buffer 40 in order to serve as an intermediary between the different lattice constants of the two semiconductor solar cells G and IGA. Light L is incident on the solar cell stack 10 through the second semiconductor solar cell IGA. It is self-evident that the labels of the individual solar cells G, IGA, IGP indicate the chemical substances used by preference, which is to say G stands for germanium, IGA for indium gallium arsenide, and IGP for indium gallium phosphide. In the following, GA refers to gallium arsenide, and IGA1 and IGA2 refer to different compositions, which is to say stoichiometries, in comparison to one another and in comparison to the IGA solar cell.

One or more intermediate layers, for example, with the same lattice constant "a" as the first semiconductor solar cell G, can be formed between the first semiconductor solar cell G and the metamorphic buffer 40. In addition, one or more second intermediate layers can be formed between the first metamorphic buffer 40 and the second semiconductor solar cell IGA.

In the representation of the individual layers, the depicted width of each given layer is a measure for the lattice constant of the applicable layer. In the individual layers, the lattice constant is represented in some cases as unchanging and also as increasing or as decreasing across the thickness of the layer. It is a matter of course that the in-plane lattice constants at the boundary between two layers of the abutting layers are approximately equal.

In the present case, the first metamorphic buffer 40 has a total of six individual buffer layers. Formed on the first semiconductor solar cell G is a first metamorphic buffer layer MP1 of the metamorphic buffer 40 with a somewhat larger lattice constant a than the lattice constant a of the first semiconductor solar cell G. Arranged on the first buffer layer MP1 is a second metamorphic buffer layer MP2 formed with a somewhat larger lattice constant than the lattice constant of the first metamorphic buffer layer MP1. Arranged on the second buffer layer MP2 is a third metamorphic buffer layer MP3 formed with a somewhat larger lattice constant than the lattice constant of the second metamorphic buffer layer MP2. Arranged on the third buffer layer MP3 is a fourth metamorphic buffer layer MP4 formed with a somewhat larger lattice constant than the lattice constant of the third metamorphic buffer layer MP3. Arranged on the fourth buffer layer MP4 is a fifth metamorphic buffer layer MP5 formed with a somewhat larger lattice constant than the lattice constant of the fourth metamorphic buffer layer MP4. Arranged on the fifth buffer layer MP5 is a sixth metamorphic buffer layer MP6 formed with a somewhat smaller lattice constant than the lattice constant of the fifth metamorphic buffer layer MP5. Formed such that it rests on the sixth buffer layer MP6 is the second semiconductor solar cell IGA.

Selected physical parameters for the region of the metamorphic buffer 40 and the first semiconductor solar cell G, and in some cases for the second semiconductor solar cell IGA, are plotted parallel to the solar cell stack 10 in a first graph D1 and in a second graph D2 and in a third graph D3. In the first graph D1, the magnitude of the lattice constant a and the magnitude of the band gap Eg are plotted along the x-axis, and the sequence of the individual layers is plotted along the y-axis. In the second graph D2, the indium content and the aluminum content are plotted along the x-axis, and the sequence of the individual layers is represented along the y-axis. Furthermore, in the third graph D3, the arsenic content, the phosphorus content, and the indium content are plotted along the x-axis. In the two graphs D2 and D3, the individual dopant curves are labeled with the chemical symbols. However, only the complete names of the relevant chemical elements are given in the explanation below. The graphs D2 and D3 illustrate two different embodiments.

In the first graph D1, it is apparent that the lattice constant a increases from the first semiconductor solar cell G to the fifth metamorphic buffer layer MP5, and decreases at the sixth metamorphic buffer layer MP6, to then remain constant in the two subsequent semiconductor solar cells IGA and IGP. For reasons of clarity, the curve of the unstrained lattice constant a is shown in steps. It could be assumed, for example, that the in-plane lattice constant a changes nearly continuously in the mostly very thin layers. In an exemplary embodiment, layers with thicknesses of less than 600 nm can be referred to as thin layers. In contrast to the curve of the lattice constant a, the energy of the band gap Eg increases abruptly from the first semiconductor solar cell G to the first metamorphic buffer layer MP1. In the curve from the first metamorphic buffer layer MP1 to and including the fourth metamorphic buffer layer MP4, the energy of the band gap Eg remains on the level of the first metamorphic buffer layer MP1 with minor fluctuations. Sufficient transparency of the metamorphic buffer is ensured by this means. From the fourth metamorphic buffer layer buffer MP4 to the fifth metamorphic buffer layer MP5, the energy of the band gap Eg decreases again, although it remains above the initial level given by the first semiconductor solar cell G. In the rest of the curve from the fifth metamorphic buffer layer MP5 to the sixth metamorphic buffer layer MP6 and to the second semiconductor solar cell IGA, the energy of the band gap Eg continues to increase in steps.

The second graph D2 describes an embodiment according to the invention with a metamorphic buffer formed of AlInGaAs and InGaAs layers. In the second graph D2, it is apparent that only the fourth metamorphic buffer layer MP4 has a strongly increased aluminum content. The two metamorphic buffer layers MP3 and MP5 directly connected to the fourth metamorphic buffer layer MP4, like the other layers of the metamorphic buffer, have a significantly lower aluminum content. In contrast to the aluminum content curve, the indium content rises in steps from the first metamorphic buffer layer MP1 to and including the fifth metamorphic buffer layer MP5, and in analogous fashion to the lattice constant a in graph D1. Then the indium content decreases again from the fifth metamorphic buffer layer MP5 to the sixth metamorphic buffer layer MP6. In other words, the fourth metamorphic buffer layer MP4 has the highest aluminum content and the second highest indium content in the metamorphic buffer. It should be noted here, too, that the individual compositions in each of the layers are represented as homogeneous for reasons of clarity. The composition can change continuously at the boundaries between two contiguous layers. In addition, the fourth metamorphic buffer layer MP4 can correspond to the second layer mentioned initially in the description. Moreover, the first layer and the third layer initially mentioned in the description correspond in this example to the third metamorphic buffer layer MP3 and the fifth metamorphic buffer layer MP5, respectively.

The third graph D3 describes an embodiment according to the invention with a metamorphic buffer composed of InGaAs and InGaP layers. In the third graph D3, the phosphorus content remains nearly constant from the first metamorphic buffer layer MP1 to and including the sixth metamorphic buffer layer MP6, with the exception of the fourth metamorphic buffer layer MP4. The layers MP1 to MP6 are made of phosphides in the present case. The fourth metamorphic buffer layer MP4 has no phosphorus in the present case. In contrast thereto, only the fourth metamorphic buffer layer MP4 has an arsenic content. In other words, the fourth metamorphic buffer layer MP4 is made of arsenides. The properties of layer MP4 can be adjusted such that an especially low nanohardness, or a soft layer, can be produced as compared to the surrounding metamorphic buffer layers MP3 and MP5.

Figure 2:
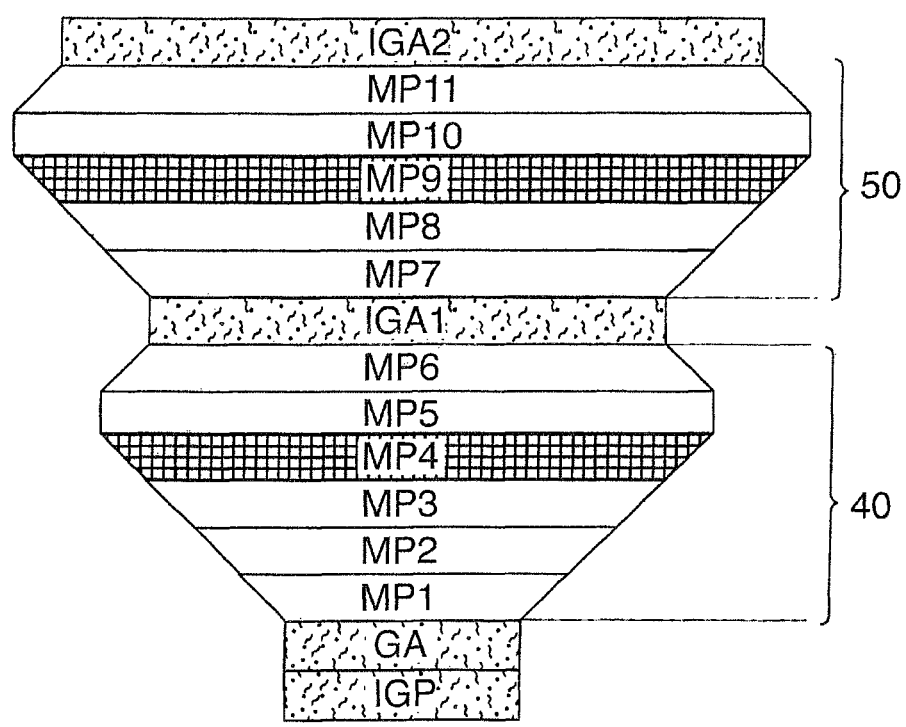
FIG. 2 shows a sequence with two consecutive metamorphic buffers.

In the illustration in FIG. 2, an embodiment with a sequence of two consecutive metamorphic buffers is shown. Only the differences from the embodiment shown in FIG. 1 are explained below. The width of the individual layers should again be viewed as a measure for the size of the lattice constant. Accordingly, the lattice constant of the second metamorphic buffer 50 is larger on average than the lattice constant of the first buffer 40 on average. The first metamorphic buffer 40 is formed between the first semiconductor solar cell formed of GA and the second semiconductor solar cell formed of IGA1. The second metamorphic buffer 50 with a sequence of a total of five metamorphic buffer layers is formed between the second semiconductor solar cell IGA1 and the fourth semiconductor solar cell formed of IGA2, starting with the seventh metamorphic buffer layer MP7 up to and including the eleventh metamorphic buffer layer MP11. Adjoining the first semiconductor solar cell GA is a third semiconductor solar cell IGP.

In the second metamorphic buffer 50, the ninth metamorphic buffer layer MP9 corresponds to the fourth metamorphic buffer layer MP4, wherein according to the invention both layers either have a higher aluminum content than the surrounding semiconductor layers MP3 and MP5 or MP8 and MP9, or in contrast to the other semiconductor layers MP1, MP2, MP3, MP5, and MP6, or MP7, MP8, MP10, and MP11, are made of an arsenide compound instead of a phosphide compound. In this way, the ninth metamorphic buffer layer MP9, just like the metamorphic buffer layer MP4, has a lower nanohardness than the two immediately adjacent metamorphic buffer layers MP8 and MP10 or MP3 and MP4. In other words, in addition to the fourth metamorphic buffer layer MP4 that forms a "predetermined breaking point," the ninth metamorphic buffer layer MP9 constitutes another "predetermined breaking point."

It is an advantage that relatively great lattice differences of individual semiconductor solar cells that are to be stacked upon one another in situ can easily be compensated for with the manufacture of a sequence of multiple metamorphic buffers. In the process, possible dislocations can be reliably trapped in the softer layers of the metamorphic buffers 40 and 50.

Figure 3:
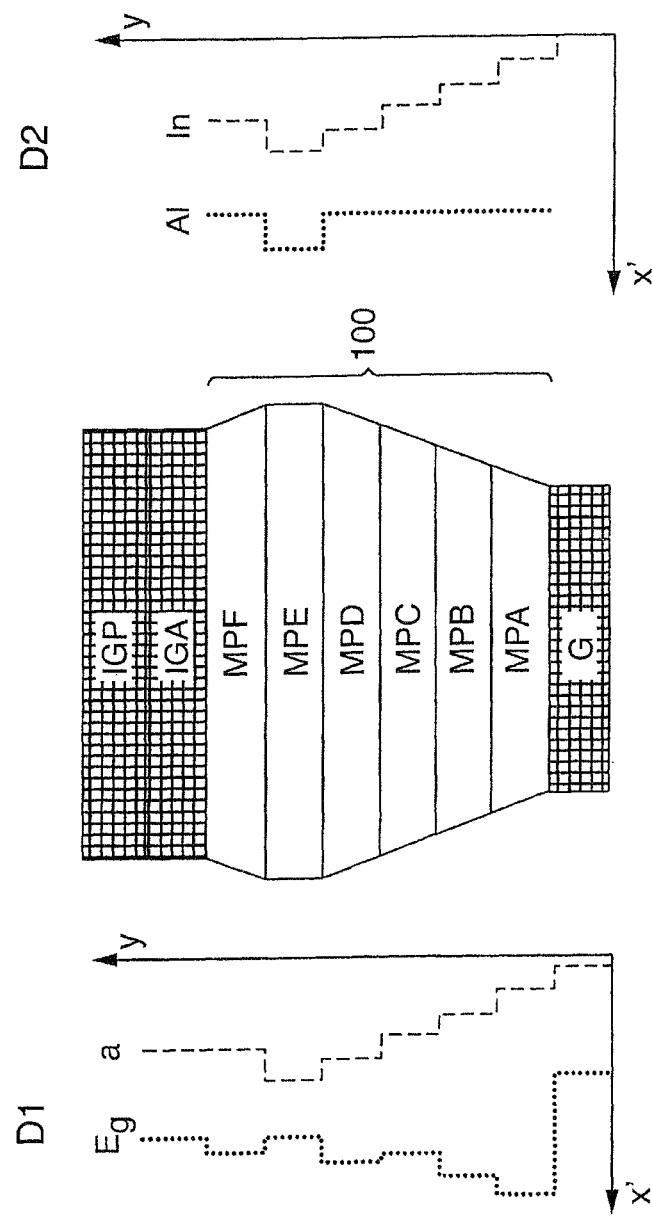
FIG. 3 shows a view of metamorphic buffers according to the prior art.

An embodiment according to the prior art of a metamorphic buffer 100 is shown in FIG. 3. Herein, the metamorphic InGaAs buffer 100 is formed of six metamorphic buffer layers MPA to MPF. The metamorphic buffer 100 is located between the first semiconductor solar cell G and the second semiconductor solar cell IGA. The second semiconductor solar cell IGA is covered by the third semiconductor solar cell IGP.

Since the metamorphic buffer is formed only of InGaAs and AlInGaAs, only the two graphs D1 and D2 are shown in the present case. While the curve of the lattice constant a shown in the first graph D1 corresponds in a first approximation to the curve of the lattice constant a from the first embodiment of the invention, a comparison of the two curves of the band gaps Eg shows differences. Although the abrupt change in the band gap Eg is also comparable in the prior art at the boundary between the first semiconductor solar cell G and the metamorphic buffer layer MPA, as the curve continues the size of the band gap decreases virtually continuously with the exception of a few minor upward bumps, with the band gap Eg of the second semiconductor solar cell ultimately still being substantially higher than the band gap Eg of the first semiconductor solar cell G. No sharp drop in the size of the band gap Eg approximately in the center of the metamorphic buffer 100 is formed in the metamorphic buffer 100 according to the prior art, however.

The curve of the indium content in graph D2 also exhibits a stepwise increase between a layer MPA and a layer MPE. There are differences from the curve according to the invention in the curve of the aluminum content, however, which is to say in the prior art aluminum is added in the layers MPA to MPF in order to increase the band gap of the buffer layers and improve the transparency of the metamorphic buffer. Since InGaAs layers with a higher indium content have a smaller band gap, a high aluminum content is also desirable, especially in layers having a high indium content. Since the layer MPE in the present case has a greater lattice constant than the second semiconductor solar cell IGA, a high aluminum content is also necessary for layer MPE in particular in order to guarantee the desired transparency. In contrast to the subject matter of the invention, however, the aluminum content is not further reduced in layers having a greater indium content.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A solar cell stack comprising:
   a first semiconductor solar cell having a p-n junction of a first material with a first lattice constant;
   a second semiconductor solar cell having a p-n junction of a second material with a second lattice constant, the first lattice constant being smaller than the second lattice constant; and
   a metamorphic buffer comprising a sequence of consecutive layers with a first, lower layer and a second, center layer, and a third, upper layer, the metamorphic buffer further comprising an InGaAs and/or an AlInGaAs and/or an InGaP and/or an AlInGaP compound, the metamorphic buffer being formed between the first semiconductor solar cell and the second semiconductor solar cell, a lattice constant in the metamorphic buffer changes along a thickness dimension of the metamorphic buffer,
   wherein the second layer has a higher Al content than the first layer and the third layer, and the second layer has a lower phosphorus content than the first layer and the third layer, and the second layer has a higher arsenic concentration than the first and the third layer,
   wherein a lattice constant of the third layer is greater than a lattice constant of the second layer,
   wherein the lattice constant of the second layer is greater than a lattice constant of the first layer,
   wherein one layer of the metamorphic buffer has a third lattice constant, and
   wherein the third lattice constant is greater than the lattice constant of the second semiconductor solar cell.

2. The solar cell stack according to claim 1, wherein the lattice constant of the metamorphic buffer increases from layer to layer in a direction of the second semiconductor solar cell by at least 0.003 Å at a time.

3. The solar cell stack according to claim 1, wherein the lattice constant of the metamorphic buffer increases from layer to layer in the direction of the second semiconductor solar cell by at least 0.005 Å at a time.

4. The solar cell stack according to claim 1, wherein the second layer of the metamorphic buffer has a lattice constant of equal size to that of the second semiconductor solar cell, or wherein the second layer of the metamorphic buffer has a lattice constant that is a maximum of 0.008 Å greater than that of the second semiconductor solar cell.

5. The solar cell stack according to claim 1, wherein the second layer has a greater lattice constant than the first semiconductor solar cell.

6. The solar cell stack according to claim 1, wherein a fourth layer is provided, the fourth layer being arranged above the third layer and being integrally joined to the third layer, and wherein the fourth layer has a smaller lattice constant than the second semiconductor solar cell.

7. The solar cell stack according to claim 1, wherein the Al content of the second layer is greater than the Al content of any other layer of the metamorphic buffer.

8. The solar cell stack according to claim 1, wherein the first layer is integrally joined to the second layer, and wherein the second layer is integrally joined to the third layer.

9. The solar cell stack according to claim 1, wherein the first layer and the third layer have a greater nanohardness than the second layer.

10. The solar cell stack according to claim 1, further comprising a third semiconductor solar cell having a p-n junction and an additional metamorphic buffer formed between the second semiconductor solar cell and the third semiconductor solar cell.

11. The solar cell stack according to claim 1, wherein each of the semiconductor solar cells contains a p-n junction.

12. The solar cell stack according to claim 1, wherein the second layer has no nitride compound.

13. The solar cell stack according to claim 1, wherein the metamorphic buffer layers are not part of a p-n junction of a tunnel diode, the sequence of consecutive layers of the metamorphic buffer directly contacting the first semiconductor solar cell and the second semiconductor solar cell.

14. The solar cell stack according to claim 1, further comprising:
 another metamorphic buffer in addition to the metamorphic buffer formed between the first semiconductor solar cell and the second semiconductor solar cell.

15. A solar cell stack comprising:
 a first semiconductor solar cell having a p-n junction of a first material with a first lattice constant;
 a second semiconductor solar cell having a p-n junction of a second material with a second lattice constant, the first lattice constant being smaller than the second lattice constant; and
 a metamorphic buffer comprising a sequence of consecutive layers with a first, lower layer and a second, center layer, and a third, upper layer, the metamorphic buffer further comprising an AlInGaP compound, the metamorphic buffer being formed between the first semiconductor solar cell and the second semiconductor solar cell, a lattice constant in the metamorphic buffer changes along a thickness dimension of the metamorphic buffer,
 wherein the second layer has a higher Al content than the first layer and the third layer and wherein the second layer has a lower phosphorus content than the first layer and the third layer,
 wherein a lattice constant of the third layer is greater than a lattice constant of the second layer,
 wherein the lattice constant of the second layer is greater than a lattice constant of the first layer,
 wherein one layer of the metamorphic buffer has a third lattice constant, and
 wherein the third lattice constant is greater than the lattice constant of the second semiconductor solar cell.

16. The solar cell stack according to claim 1, wherein each of the first, lower layer and the second, center layer, and the third, upper layer of the metamorphic buffer contain Al.

17. The solar cell stack according to claim 15, wherein each of the first, lower layer and the second, center layer, and the third, upper layer of the metamorphic buffer contain Al.

18. The solar cell stack according to claim 15, wherein each of the first, lower layer and the second, center layer, and the third, upper layer of the metamorphic buffer comprise AlInGaP.

19. The solar cell stack according to claim 15, wherein the sequence of consecutive layers of the metamorphic buffer are not part of a p-n junction of a tunnel diode, the sequence of consecutive layers of the metamorphic buffer directly contacting the first semiconductor solar cell and the second semiconductor solar cell.

* * * * *